United States Patent
Oberai et al.

(10) Patent No.: US 11,763,059 B2
(45) Date of Patent: Sep. 19, 2023

(54) NET-BASED WAFER INSPECTION

(71) Applicant: Synopsys, Inc., Mountain View, CA (US)

(72) Inventors: Ankush Bharati Oberai, Fremont, CA (US); Rajesh Ramesh Sahani, Mumbai (IN)

(73) Assignee: Synopsys, Inc., Sunnyvale, CA (US)

( * ) Notice: Subject to any disclaimer, the term of this patent is extended or adjusted under 35 U.S.C. 154(b) by 0 days.

(21) Appl. No.: 17/125,128

(22) Filed: Dec. 17, 2020

(65) Prior Publication Data

US 2021/0192116 A1    Jun. 24, 2021

Related U.S. Application Data

(60) Provisional application No. 62/952,758, filed on Dec. 23, 2019.

(51) Int. Cl.
  *G06F 30/392* (2020.01)
  *G06F 30/398* (2020.01)
  *G06F 30/323* (2020.01)

(52) U.S. Cl.
  CPC .......... *G06F 30/392* (2020.01); *G06F 30/323* (2020.01); *G06F 30/398* (2020.01)

(58) Field of Classification Search
  CPC ............................. G06F 30/392; G06F 30/398
  USPC ........................................................ 716/103
  See application file for complete search history.

(56) References Cited

U.S. PATENT DOCUMENTS

| | | | | |
|---|---|---|---|---|
| 5,828,778 A | * | 10/1998 | Hagi | G06T 7/0004 382/145 |
| 5,991,699 A | * | 11/1999 | Kulkarni | H01L 22/20 700/121 |
| 8,826,209 B2 | | 9/2014 | Kramer et al. | |
| 2007/0288219 A1 | * | 12/2007 | Zafar | G06T 7/0008 703/14 |
| 2008/0072207 A1 | * | 3/2008 | Verma | G03F 1/84 716/52 |
| 2008/0167829 A1 | * | 7/2008 | Park | G01R 31/2894 702/81 |
| 2009/0080759 A1 | * | 3/2009 | Bhaskar | G06T 1/20 382/141 |
| 2012/0050728 A1 | | 3/2012 | Fayaz et al. | |
| 2014/0355867 A1 | | 12/2014 | Lin et al. | |
| 2017/0212168 A1 | * | 7/2017 | Leu | G01R 31/3177 |
| 2017/0256466 A1 | * | 9/2017 | Bishop | G06T 7/0004 |
| 2018/0047149 A1 | * | 2/2018 | Trumbauer | G06T 7/001 |

OTHER PUBLICATIONS

Gao, Weihong et al., "Net Tracing and Classification Analysis on E-Beam Die-to-Database Inspection", Proceedings of SPIE ISSN 0277-786X, vol. 9778, Mar. 24, 2016, pp. 97783Q-1-97783Q-6.

* cited by examiner

*Primary Examiner* — Suchin Parihar
(74) *Attorney, Agent, or Firm* — Park, Vaughan, Fleming & Dowler LLP; Laxman Sahasrabuddhe

(57) ABSTRACT

A defect map may be created by merging defects at locations on multiple dies that include copies of an integrated circuit (IC). Layout shapes or nets may be determined that overlap with the defects in the defect map. Next, connectivity between the layout shapes or nets may be determined. The defects may then be grouped into defect groups based on the connectivity between the layout shapes or nets, where each defect group comprises defects that overlap with layout shapes or nets that are electrically connected to each other.

20 Claims, 6 Drawing Sheets

NET-BASED WAFER INSPECTION

RELATED APPLICATION

This application claims the benefit of U.S. Provisional Application Ser. No. 62/952,758, filed on 23 Dec. 2019, the contents of which are herein incorporated by reference in their entirety for all purposes.

TECHNICAL FIELD

The present disclosure relates to integrated circuit (IC) design and manufacturing. More specifically, the present disclosure relates to net-based wafer inspection.

BACKGROUND

While an IC is being manufactured based on an IC design, defects (if any) in the IC may be detected using wafer inspection. The detected defects can be categorized as real defects or false alarms. A real defect is a defect that causes the IC to malfunction or not meet the desired performance goals, whereas a false alarm is a defect that can be ignored because it does not impact the functionality or performance of the IC in any meaningful way. The false alarm ratio is the ratio of the number of false alarms to the total number of detected defects. It is desirable to have a low false alarm ratio.

As device geometries continue to shrink, the total number of detected defects and the false alarm ratio are increasing dramatically. Wafer inspection may require a large amount of time and resources if the number of detected defects is large and the false alarm ratio is high. Moreover, real defects may be missed, which may result in lower yields and higher manufacturing costs.

SUMMARY

Some embodiments described herein may create a defect map by merging defects at locations on multiple dies that include copies of an IC. Next, the embodiments may determine layout shapes that overlap with the defects in the defect map. The embodiments may then determine connectivity between the layout shapes. Specifically, the connectivity between the layout shapes may be determined by tracing electrical connectivity between the layout shapes across one or more layers of the IC. Next, the embodiments may group the defects into defect groups based on the connectivity between the layout shapes, where each defect group comprises defects that overlap with layout shapes that are electrically connected to each other.

Some embodiments may create a database that enables layout data, netlist data, or both layout data and netlist data of an IC design to be looked up based on a location of a defect in a die that includes the IC. In these embodiments, for each defect in the defect map, the database may be used to look up layout data, netlist data, or both layout data and netlist data based on the location of the defect. The embodiments may then group the defects into defect groups based on the associated layout data, netlist data, or both layout data and netlist data.

Some embodiments may prioritize and/or select defect groups based on a count of defects in the defect groups, attributes of the defects, layout data associated with the defects, and/or netlist data associated with the defects.

Specifically, some embodiments may select defect groups that include more than a threshold number of defects. Some embodiments may select defect groups having at least one defect with a size greater than a threshold size. Some embodiments may select defect groups associated with critical nets. Some embodiments may select defect groups associated with nets having a width less than a threshold width.

BRIEF DESCRIPTION OF THE FIGURES

The disclosure may be understood based on the detailed description given below and the accompanying figures. The figures are for illustrative purposes, and do not limit the scope of the disclosure. Furthermore, the figures are not necessarily drawn to scale.

DETAILED DESCRIPTION

Aspects of the present disclosure relate to net-based wafer inspection. There has been a significant increase in the number of defects that are detected and that need to be processed during wafer inspection. Moreover, the false alarm ratio has also increased.

In this disclosure, the term "defect" may refer to a deviation (which is greater than a tolerance amount) between a printed pattern on a wafer and a design intent, and which is detected by an wafer inspection tool. During semiconductor manufacturing, a wafer goes through multiple processing stages. The results after one or more processing stages may be inspected using wafer inspection tools. Wafer inspection tools may capture an image of the wafer by using optical or electron beam techniques, and then use image processing techniques to detect defects. During wafer inspection, a defect may be detected if the observed deviation between a printed shape and the corresponding design intent (which describes the shapes that are desired to be printed on the wafer) is greater than a tolerance. For example, if a space is supposed to exist between two layout shapes in the design intent, and the wafer inspection tool detects that no space exists between the corresponding printed shapes, then the wafer inspection tool may indicate that a defect exists at the location where the space was expected.

The increases in the number of defects and the false alarm ratio are due to shrinking geometries and physical limitations of wafer inspection tools. For example, at the N22 process technology node, the false alarm ratio was typically less than 50%, but for the N5 process technology node, the false alarm ratio has been found to be more than 90%. Analyzing such a high number of defects and segregating the real defects from the false alarms can be very time consuming and error prone. With high false alarm ratios, there is a high probability of missing real and important defects. Optical wafer inspection errors at different semiconductor manufacturing steps may cause a defective wafer to pass inspection, which may lead to low yield and higher manufacturing cost.

Embodiments disclosed herein provide techniques and systems for using layout and netlist data associated with defects to identify defects that have a high likelihood of being real defects. The identified defects, which may be a small fraction of the total number of defects, may then be analyzed further to confirm that the defects are real, and to determine a solution (e.g., changes to the layout) to fix the defects. Advantages of embodiments disclosed herein include, but are not limited to, (1) providing a system for using various layout and net based properties of an IC design to differentiate between real defects and false alarms, and (2) accurately segregating real defects from false alarms, thereby significantly reducing the amount of time and resources required for wafer inspection.

Figure 1:
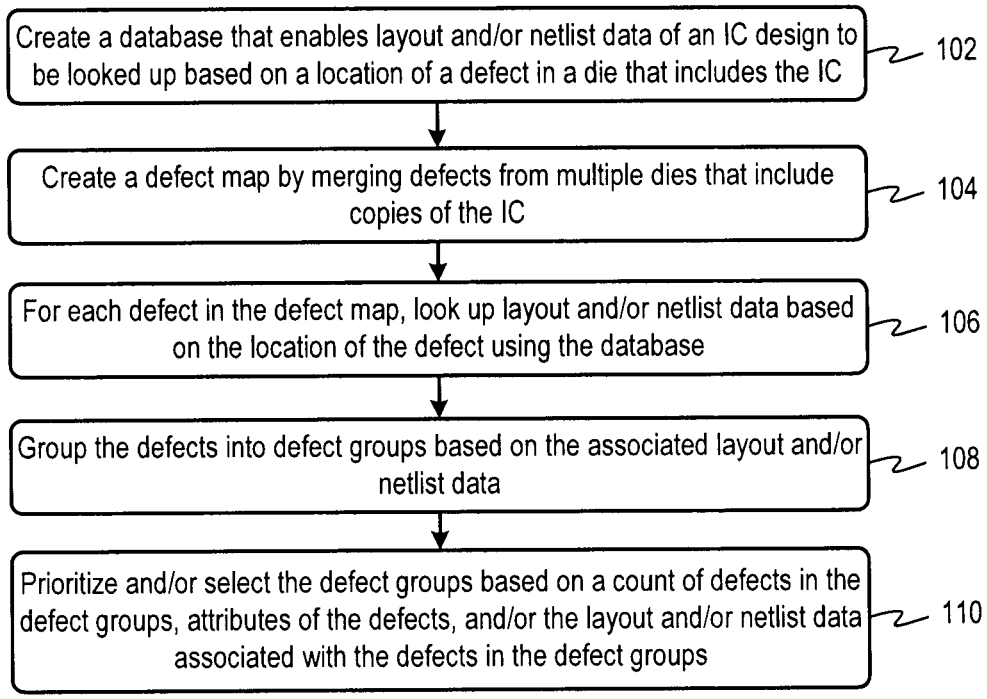
FIG. 1 illustrates a process for prioritizing and/or selecting defects in accordance with some embodiments described herein.

FIG. 1 illustrates a process for prioritizing and/or selecting defects in accordance with some embodiments described herein.

The process may begin by creating a database that enables layout and/or netlist data of an IC design to be looked up based on a location of a defect in a die that includes the IC (at 102). A high level description of an IC design may be converted into a netlist, and subsequently into a layout. The layout may then be used to create photolithography masks that are used during manufacturing. The term "netlist" may refer to a network of cells (e.g., AND gates, OR gates, MUXs, etc.) that implement the desired functionality of the IC design. The term "cell" may represent an actual portion of an IC that is created when the IC design is manufactured. A netlist may refer to a list (or collection) of nets, where each "net" may refer to the set of routing shapes that electrically connect inputs and outputs of cells. The term "layout" may refer to the shapes that are desired to be manufactured. Specifically, the shapes in a layout may represent physical structures that implement transistors and electrical connections in the IC.

Figure 2:
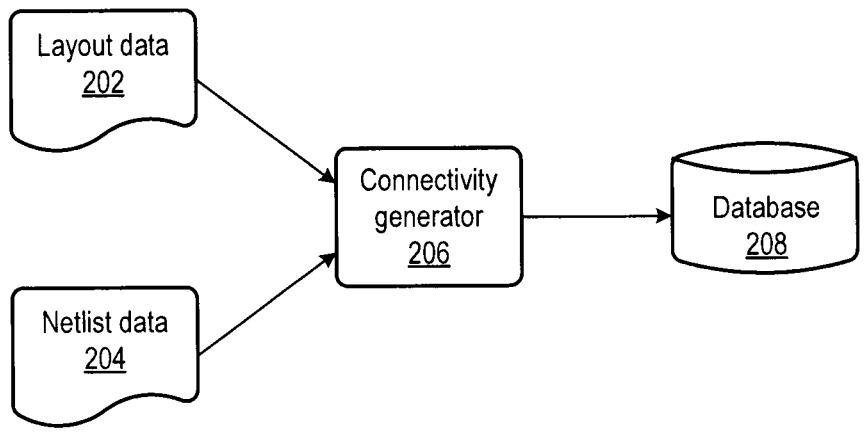
FIG. 2 illustrates a connectivity generator in accordance with some embodiments disclosed herein.

FIG. 2 illustrates a connectivity generator in accordance with some embodiments disclosed herein.

Connectivity generator 206 (which may be a software module that is executed by a processor) may receive layout data 202 and/or netlist data 204. Next, connectivity generator 206 may determine connectivity between shapes in layout data 202, and/or extract connectivity information from netlist data 204. Connectivity generator 206 may store the connectivity information between shapes and/or nets, and the location of the shapes and/or nets in database 208, so that database 208 can be used to perform lookups of layout shapes and/or nets based on a location of a defect.

Next, referring to FIG. 1, the process may create a defect map by merging defects from multiple dies that include copies of the IC (at 104). A semiconductor manufacturing process may be used to create multiple copies of an IC on a wafer, and each copy of the IC may be referred to as a "die." Each die may include defects that may be caused by random or systematic processes. Random defects may occur due to random variations in the physical and/or chemical processes that are used during manufacturing. Systematic defects may be caused by a specific arrangement of shapes in a region of the IC design that does not produce the desired shapes on the wafer. It is desirable to identify systematic defects so that the layout shapes in the IC design may be modified (e.g., by using resolution enhancement techniques such as optical proximity correction and/or assist feature placement) to fix the systematic defect.

Figure 3:
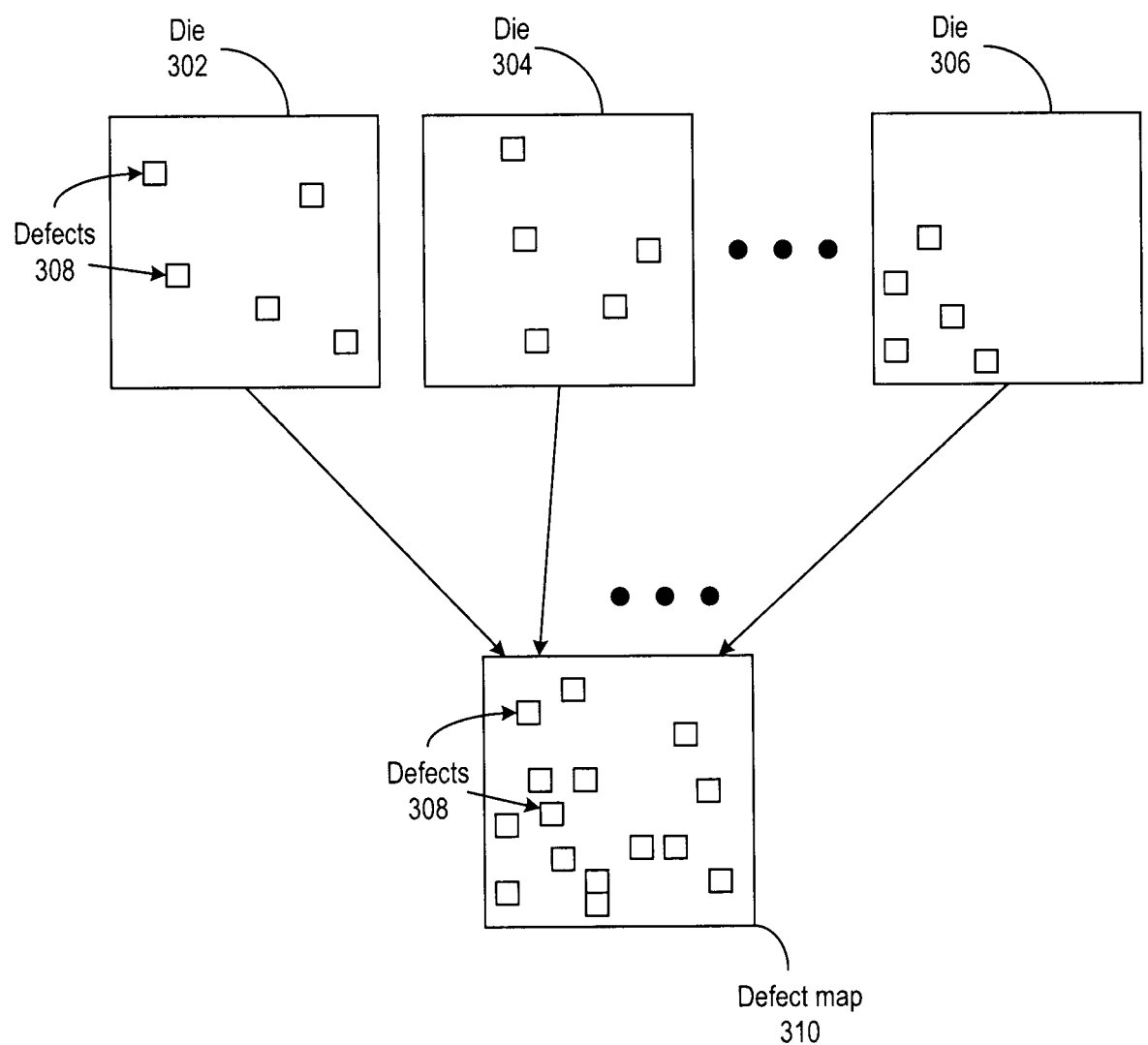
FIG. 3 illustrates a defect map in accordance with some embodiments disclosed herein.

FIG. 3 illustrates a defect map in accordance with some embodiments disclosed herein.

Multiple dies, e.g., dies 302, 304, and 306, may include copies of an IC that is manufactured based on an IC design. Each die may include zero or more defects, e.g., defects 308. Some embodiments disclosed herein may merge the defects on the multiple dies to create defect map 310, so that defect map 310 includes the defects from all of the dies.

Next, referring to FIG. 1, for each defect in the defect map, the process may look up layout and/or netlist data based on the location of the defect using the database (at 106). The process may then group the defects into defect groups based on the associated layout and/or netlist data (at 108).

Figure 4:
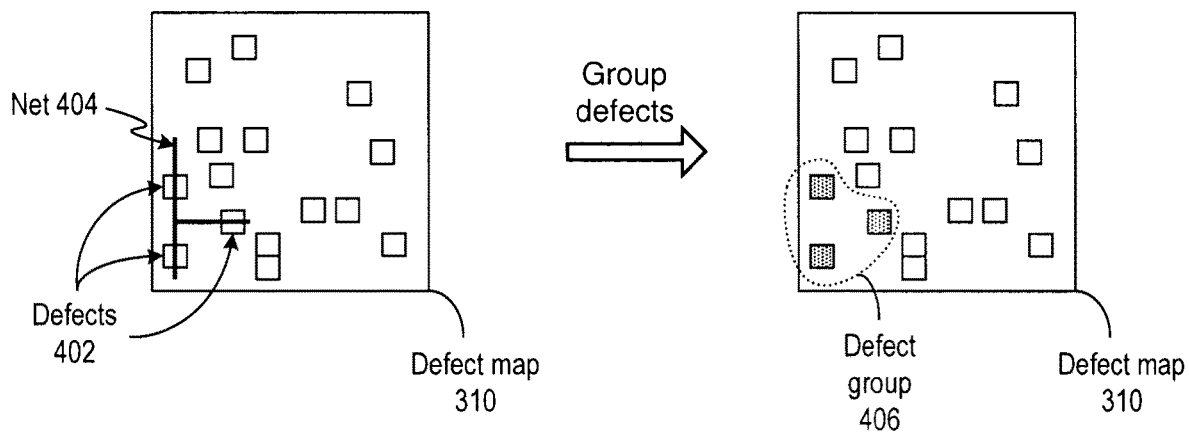
FIG. 4 illustrates grouping defects in accordance with some embodiments disclosed herein.

FIG. 4 illustrates grouping defects in accordance with some embodiments disclosed herein.

For each defect in defect map 310, embodiments disclosed herein may use the location of the defect to lookup the associated layout and/or netlist data from database 208. For example, defects 402 include three distinct defects (which may have occurred on the same or different dies). When the location of each of these three defects is looked up using database 208, the same net (net 404) may be returned by the database lookup operation. Thus, embodiments disclosed herein may associate the three defects 402 with net 404, and the embodiments may create defect group 406 that includes the three defects 402.

The following example illustrates how layout data may be processed by connectivity generator 206, and how database 208 may be used to group defects. Suppose layout data 202 includes the following information: (1) metal shape S1 is connected to via V1, and (2) via V1 is connected to metal shape S2. Based on this information, connectivity generator 206 may trace the connectivity between layout shapes S1 and S2 through via V1, and determine that layout shapes S1 and S2 are part of the same net because they are electrically connected to each other. Connectivity generator 206 may store this connectivity information in database 208. Suppose that defect D1 is detected at location (X1,Y1) which is within the boundary of metal shape S1, and defect D2 is detected at location (X2, Y2), which is within the boundary of metal shape S2. Embodiments disclosed herein may look up the shapes corresponding to locations (X1,Y1) and (X2, Y2), and use the connectivity information between metal shapes S1 and S2 stored in database 208 to determine that defects D1 and D2 are associated with the same net. Accordingly, embodiments disclosed herein may group defects D1 and D2 into the same defect group. In some embodiments, the connectivity between different layout shapes may be traced "on demand" or "on-the-fly," i.e., after the layout shapes that overlap with a set of defects have been identified, the electrical connectivity between the layout shapes may be determined for grouping the defects.

Referring to FIG. 1, the process may then prioritize and/or select the defect groups based on a count of defects in the defect groups, attributes of the defects, and/or the layout and/or netlist data associated with the defects in the defect groups (at 110). Once database 208 has been created, the process may use rules to create defect groups, and to prioritize and/or select defect groups based on the layout and/or netlist data associated with the defects. The selected defect groups or higher priority defect groups may then be reviewed by using analysis tools, such as a scanning electron microscope (SEM) tool.

In some embodiments, the criticality of the net may be used to select and/or prioritize the defect groups. For example, if a set of defects are associated with a critical net, then those defects may be assigned a higher priority than other defects that are associated with non-critical nets. The term "critical net" may refer to a net whose timing slack is close to zero.

Figure 5:
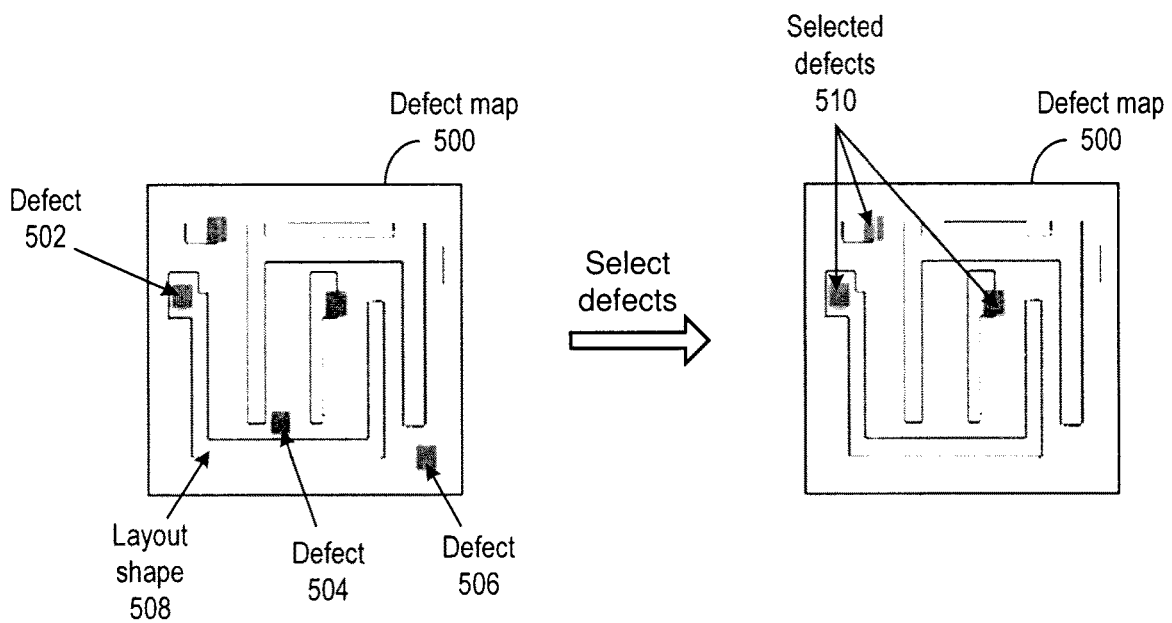
FIG. 5 illustrates selecting defects in accordance with some embodiments disclosed herein.

FIG. 5 illustrates selecting defects in accordance with some embodiments disclosed herein.

Defect map 500 may include defects 502, 504, and 506. Some defects may be located on a layout shape, whereas other defects may not be located on any layout shape, i.e., these defects may be located in the space area between layout shapes. For example, defect shape 502 is located on layout shape 508, but defect shapes 504 and 506 are not located on any layout shape. Some embodiments disclosed herein may select defects that are located on a layout shape that corresponds to a functional part of the IC, while ignoring defects that are located on non-functional parts of the IC (e.g., the space area between layout shapes). As shown in FIG. 5, selected defects 510 are located on layout shapes, and defects 504 and 506 have been filtered-out.

In other embodiments, the process may filter out the defects that match a given criterion or criteria, i.e., the process may select defects that do not match a given criterion or criteria. For example, in another embodiment, the process may select defects 504 and 506, which are not located on any layout shape, and filter out the other defects.

Some embodiments may allow a user to specify rules to select and/or prioritize defects or defect groups. For example, a user may decide to prioritize groups which contain more than three defects (or more generally, the user may prioritize groups that contain more than a threshold number of defects). Similarly, a user may define a rule that masks (or filters) the defect groups that are sent to the review tool. For example, a user may define a rule that filters out defects that are located on a fill layer, which may refer to a layer in the IC design layout that includes non-functional structures. Such user-defined rules for filtering defect groups can substantially improve the inspection efficiency by shortening the review process.

Some embodiments may allow a user to define advanced rules involving multiple nets, dimensions, spatial characteristics of defects, and create multiple combinations of filters, and create complex rules for assigning priorities. Specifically, in some embodiments, the rules that are used by the net-based inspection tool may be "SELECT" and "FILTER." These rules may be applied to the defects based on criteria that are specified in the rule. The system can use a default set of criteria, and if a user provides a set of criteria, the user-specified criteria can override the default criteria. A "SELECT" rule may return defects or defect groups that match the criterion or criteria specified in the select rule. A "FILTER" rule may return defects or defect groups that do not match the criterion or criteria specified in the filter rule. The select and filter rules may be combined using logical operators, and/or may be chained (i.e., a sequence of select and filter rules may be applied). Some examples of rules that may be used to select and/or filter defects and/or defect groups are discussed below.

In general, the rules may prioritize and/or select defects and/or defect groups based on criteria that include, but are not limited to, a count of defects in the defect groups, attributes of the defects (e.g., size, width, and/or IC design layer of a defect), and/or the layout and/or netlist data associated with the defects in the defect groups. An example that selects a defect group based on a count of defects in the defect group is "SELECT COUNT>1," which selects defect groups that have more than one defect in them. An example of a rule that uses attributes of defects is "SELECT DEFECT_SIZE>0.1 micron," which selects defects whose size is greater than 0.1 micron. A rule that selects defects based on the layout and/or netlist data associated with the defects is "FILTER NET=NULL," where the "NET=NULL" directive instructs the net-based inspection tool to filter out all defects that do not overlap with a net (and therefore the "assigned" net is "NULL"). Another rule may select defects that are located on nets that pass through multiple IC design layers. Yet another rule may select defects that are located on layout shapes whose width is less than a given threshold, e.g., "SELECT NET_WIDTH<2 micron." These examples of rules are for illustration purposes only, and are not intended to limit the scope of this disclosure.

Optical wafer inspection tools may include calibration errors, and the measurements may have error tolerances. Moreover, the physical and chemical processes used during manufacturing may create variations in the printed shapes. Some embodiments may use proximity boxes to account for such errors and variations. Specifically, some embodiments may place a proximity box around each defect, and determine whether a defect overlaps with a layout shape or net based on whether the proximity box overlaps with the layout shape or the location of the net.

Figure 6:
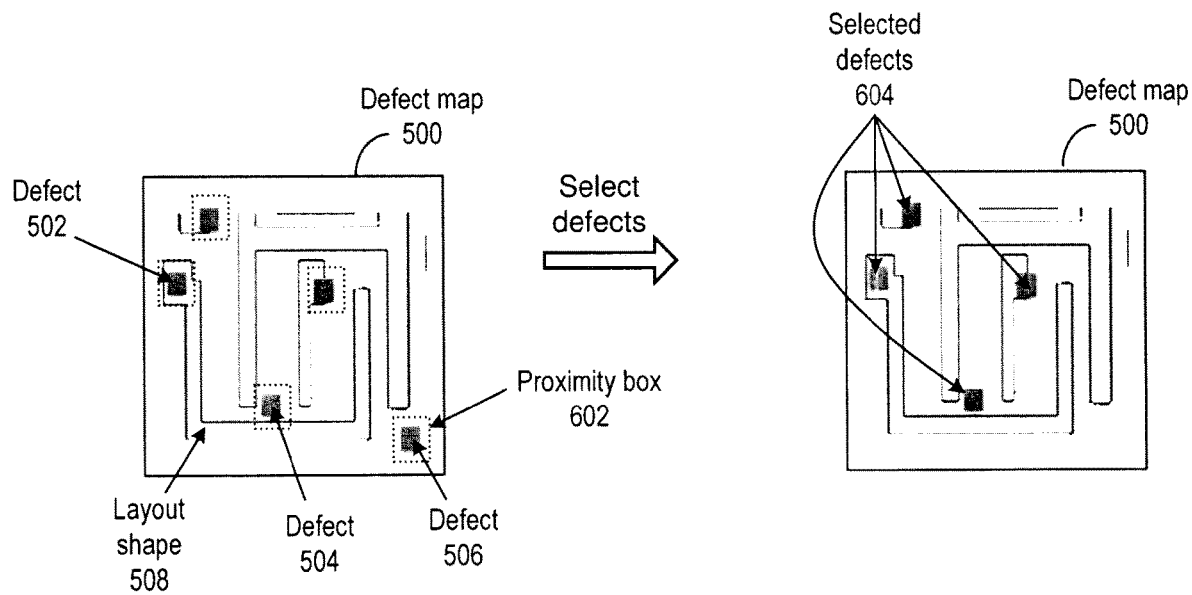
FIG. 6 illustrates selecting defects using proximity boxes in accordance with some embodiments disclosed herein.

FIG. 6 illustrates selecting defects using proximity boxes in accordance with some embodiments disclosed herein.

A proximity box has been placed around each defect in FIG. 6. For example, proximity box 602 has been placed around defect 506. In these embodiments, the process may select defects whose proximity box overlaps with a layout shape. For example, the proximity box around defect 504 overlaps with layout shape 508, and thus may be selected by the process. An example of a rule that uses proximity boxes may be "FILTER NET=NULL PBOX=0.1 micron," where the directive "PBOX=0.1 micron" instructs the net-based inspection tool to use a 0.1 micron proximity box around the defect to determine whether the defect overlaps with a layout shape or net.

Once a set of defects have been prioritized or selected by the process illustrated in FIG. 1, the selected or prioritized defects may then be reviewed and/or analyzed using a scanning electron microscope (SEM) tool.

Figure 7:
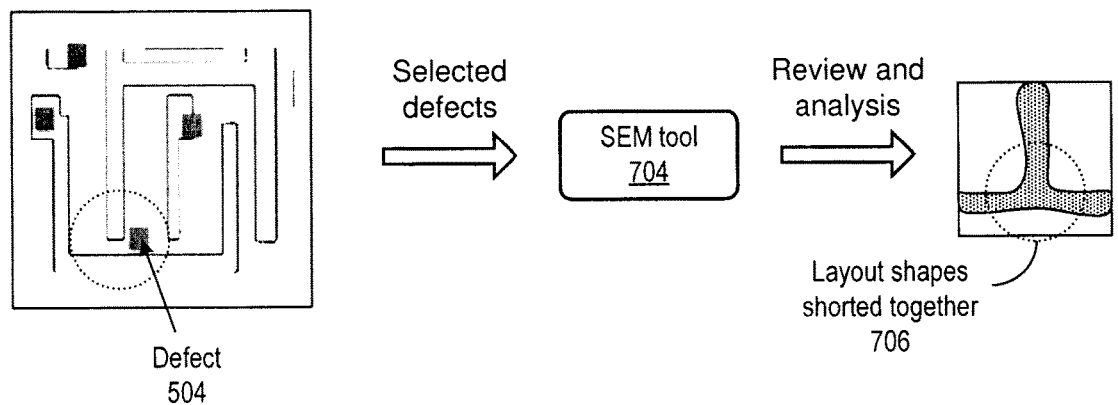
FIG. 7 illustrates review and analysis of selected defects in accordance with some embodiments disclosed herein.

FIG. 7 illustrates review and analysis of selected defects in accordance with some embodiments disclosed herein.

Embodiments disclosed herein may select defect 504 based on the layout data and/or netlist data associated with defect 504, and the region around defect 504 may be further analyzed by using SEM tool 704. The analysis may indicate that, due to a systematic problem in this region, the layout shapes were shorted together 706, which is not consistent with the IC design. Specifically, additional analysis may reveal that the resolution enhancement techniques that were applied to this region of the layout were not sufficient to print the layout shapes correctly. Accordingly, that particular region of the layout may be modified to fix the problem.

Figure 8:
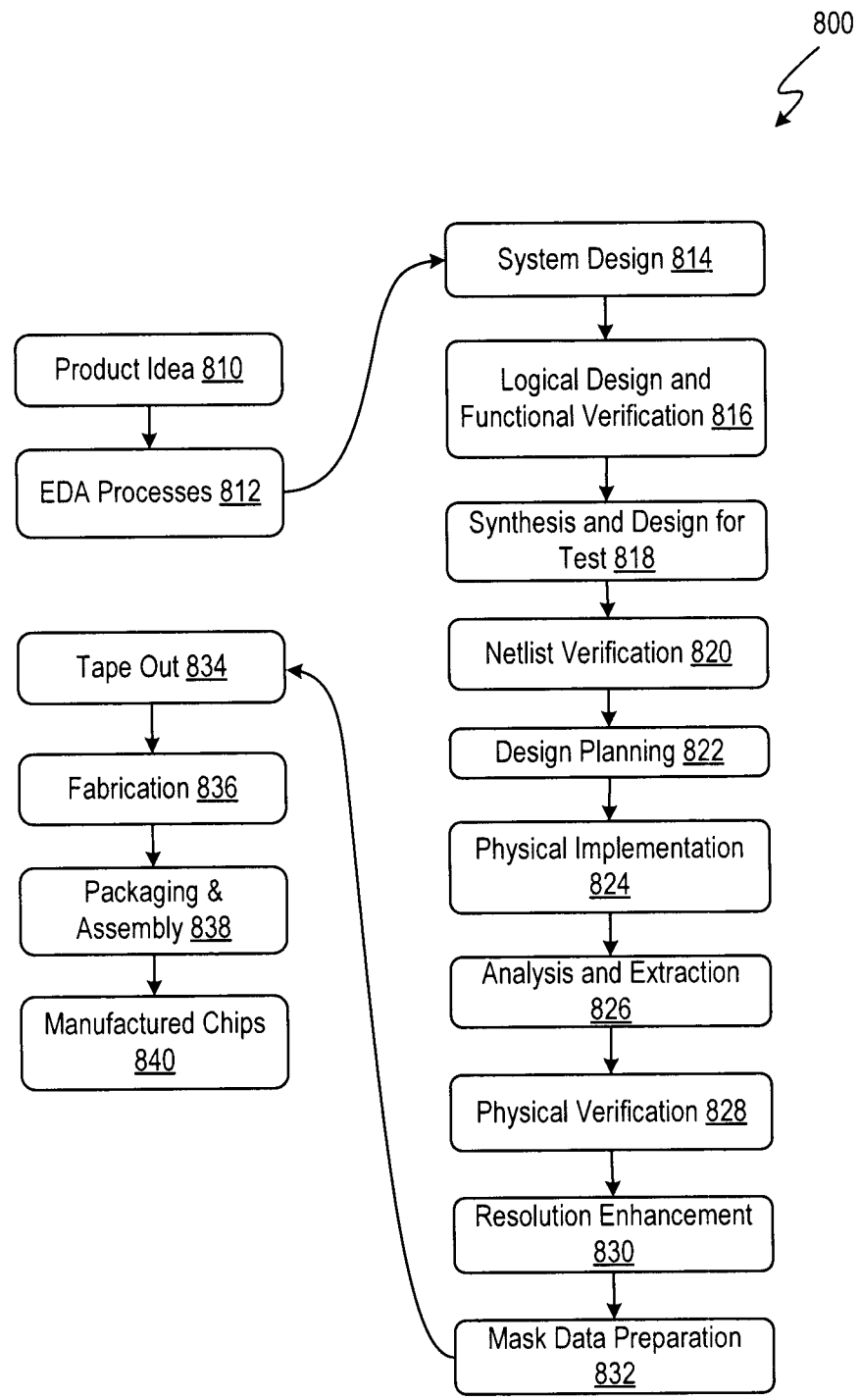
FIG. 8 illustrates an example flow for the design, verification, and fabrication of an integrated circuit in accordance with some embodiments described herein.

FIG. 8 illustrates an example flow 800 for the design, verification, and fabrication of an integrated circuit in accordance with some embodiments described herein.

EDA processes 812 (the acronym "EDA" refers to "Electronic Design Automation") can be used to transform and verify design data and instructions that represent the integrated circuit. Each of these processes can be structured and enabled as multiple modules or operations.

Flow 800 can start with the creation of a product idea 810 with information supplied by a designer, information which is transformed and verified by using EDA processes 812. When the design is finalized, the design is taped-out 834, which is when artwork (e.g., geometric patterns) for the integrated circuit is sent to a fabrication facility to manufacture the mask set, which is then used to manufacture the integrated circuit. After tape-out, a semiconductor die is fabricated 836 and packaging and assembly 838 are performed to produce the manufactured IC chip 840.

Specifications for a circuit or electronic structure may range from low-level transistor material layouts to high-level description languages. A high-level of abstraction may be used to design circuits and systems, using a hardware description language ("HDL") such as VHDL, Verilog, SystemVerilog, SystemC, MyHDL or OpenVera. The HDL description can be transformed to a logic-level register transfer level ("RTL") description, a gate-level description, a layout-level description, or a mask-level description. Each lower abstraction level that is a less abstract description adds more detail into the design description. The lower levels of abstraction that are less abstract descriptions can be generated by a computer, derived from a design library, or created by another design automation process. An example of a specification language at a lower level of abstraction language for specifying more detailed descriptions is SPICE (which stands for "Simulation Program with Integrated Circuit Emphasis"). Descriptions at each level of abstraction contain details that are sufficient for use by the corresponding tools of that layer (e.g., a formal verification tool).

During system design 814, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 816, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as "emulators" or "prototyping systems" are used to speed up the functional verification.

During synthesis and design for test 818, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 820, the netlist is checked for compliance with timing constraints and for correspondence with the HDL code. During design planning 822, an overall floor plan for the integrated circuit is constructed and analyzed for timing and top-level routing.

During layout or physical implementation 824, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 826, the circuit function is verified at the layout level, which permits refinement of the layout design. During physical verification 828, the layout design is checked to ensure that manufacturing constraints are correct, such as DRC constraints, electrical constraints, lithographic constraints, and that circuitry function matches the HDL design specification. During resolution enhancement 830, the geometry of the layout is transformed to improve how the circuit design is manufactured.

During tape-out, data is created to be used (after lithographic enhancements are applied if appropriate) for production of lithography masks. During mask data preparation 832, the 'tape-out' data is used to produce lithography masks that are used to produce finished integrated circuits.

A storage subsystem of a computer system (such as computer system 900 of FIG. 9) may be used to store the programs and data structures that are used by some or all of the EDA products described herein, and products used for development of cells for the library and for physical and logical design that use the library.

Figure 9:
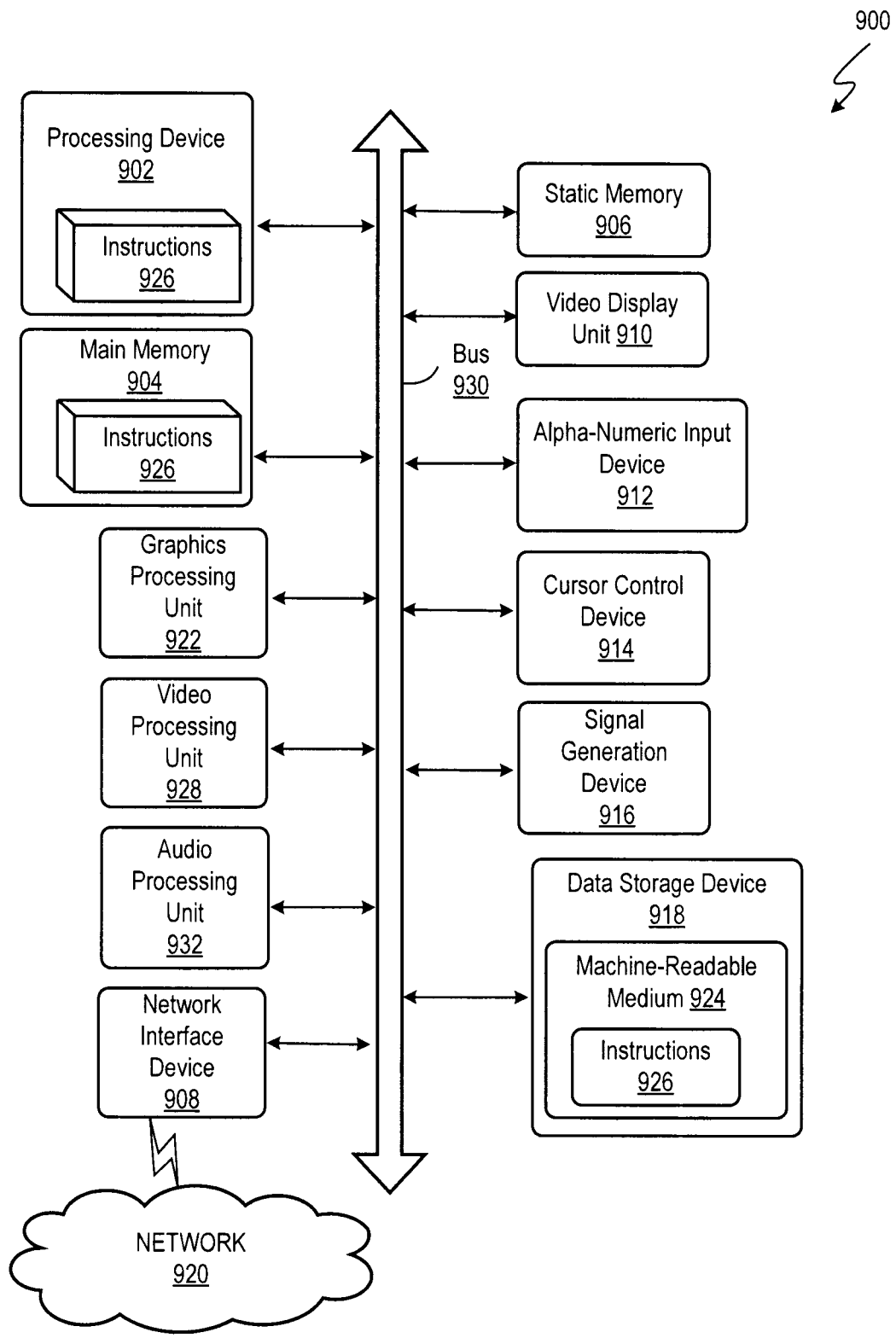
FIG. 9 illustrates an example machine of a computer system within which a set of instructions, for causing the machine to perform any one or more of the methodologies discussed herein, may be executed.

FIG. 9 illustrates an example machine of a computer system 900 within which a set of instructions, for causing the machine to perform any one or more of the methodologies discussed herein, may be executed.

In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 900 includes a processing device 902, a main memory 904 (e.g., read-only memory (ROM), flash memory, dynamic random access memory (DRAM) such as synchronous DRAM (SDRAM), a static memory 906 (e.g., flash memory, static random access memory (SRAM), etc.), and a data storage device 918, which communicate with each other via a bus 930.

Processing device 902 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 902 may also be one or more special-purpose processing devices such as an application specific integrated circuit (ASIC), a field programmable gate array (FPGA), a digital signal processor (DSP), network processor, or the like. The processing device 902 may be configured to execute instructions 926 for performing the operations and steps described herein.

The computer system 900 may further include a network interface device 908 to communicate over the network 920. The computer system 900 also may include a video display unit 910 (e.g., a liquid crystal display (LCD) or a cathode ray tube (CRT)), an alphanumeric input device 912 (e.g., a keyboard), a cursor control device 914 (e.g., a mouse), a graphics processing unit 922, a signal generation device 916 (e.g., a speaker), graphics processing unit 922, video processing unit 928, and audio processing unit 932.

The data storage device 918 may include a machine-readable storage medium 924 (also known as a non-transitory computer-readable medium) on which is stored one or more sets of instructions 926 or software embodying any one or more of the methodologies or functions described herein. The instructions 926 may also reside, completely or at least partially, within the main memory 904 and/or within the processing device 902 during execution thereof by the computer system 900, the main memory 904 and the processing device 902 also constituting machine-readable storage media.

In some implementations, the instructions 926 include instructions to implement functionality corresponding to the present disclosure. While the machine-readable storage medium 924 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 902 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A method, comprising:
creating a defect map by merging defects from multiple dies that each includes a copy of an integrated circuit (IC);
determining layout shapes that overlap with the defects in the defect map;
determining connectivity between the layout shapes; and
grouping the defects into defect groups based on the connectivity between the layout shapes, wherein each defect group comprises defects that overlap with layout shapes that are electrically connected to each other.

2. The method of claim 1, wherein the determining the connectivity between the layout shapes comprises tracing electrical connectivity between the layout shapes across one or more layers of the IC.

3. The method of claim 1, comprising selecting defect groups that include more than a threshold number of defects.

4. The method of claim 1, comprising selecting defect groups based on attributes of the defects.

5. The method of claim 4, wherein the selecting the defect groups based on the attributes of the defects comprises selecting defect groups having at least one defect with a size greater than a threshold size.

6. The method of claim 1, comprising selecting defect groups based on the associated layout data, netlist data, or both layout data and netlist data.

7. The method of claim 6, wherein the selecting the defect groups based on the associated layout data, netlist data, or both layout data and netlist data comprises selecting defect groups associated with critical nets.

8. The method of claim 6, wherein the selecting the defect groups based on the associated layout data, netlist data, or both layout data and netlist data comprises selecting defect groups associated with nets having a width less than a threshold width.

9. A system, comprising:
a memory storing instructions; and
a processor, coupled with the memory and to execute the instructions, the instructions when executed cause the processor to:
create a defect map by merging defects from multiple dies that include copies of an integrated circuit (IC);
determine layout shapes that overlap with the defects in the defect map;
determine connectivity between the layout shapes; and
group the defects into defect groups based on the connectivity between the layout shapes, wherein each defect group comprises defects that overlap with layout shapes that are electrically connected to each other.

10. The system of claim 9, wherein the instructions when executed cause the processor to select defect groups based on a count of defects in the defect groups.

11. The system of claim 10, wherein the selecting the defect groups based on the count of defects in the defect groups comprises selecting the defect groups that include more than a threshold number of defects.

12. The system of claim 9, wherein the instructions when executed cause the processor to select defect groups based on attributes of the defects.

13. The system of claim 12, wherein the selecting the defect groups based on the attributes of the defects comprises selecting defect groups having at least one defect with a size greater than a threshold size.

14. The system of claim 9, wherein the instructions when executed cause the processor to select defect groups based on the associated layout data, netlist data, or both layout data and netlist data.

15. The system of claim 14, wherein the selecting the defect groups based on the associated layout data, netlist data, or both layout data and netlist data comprises selecting defect groups associated with critical nets.

16. The system of claim 14, wherein the selecting the defect groups based on the associated layout data, netlist data, or both layout data and netlist data comprises selecting defect groups associated with nets having a width less than a threshold width.

17. A non-transitory computer-readable medium comprising stored instructions, which when executed by a processor, cause the processor to:
create a database that enables layout data, netlist data, or both layout data and netlist data of an integrated circuit (IC) design to be looked up based on a location of a defect in a die that includes the IC;
create a defect map by merging defects from multiple dies that include copies of the IC;
for each defect in the defect map, look up layout data, netlist data, or both layout data and netlist data based on the location of the defect using the database; and
group the defects into defect groups based on the associated layout data, netlist data, or both layout data and netlist data.

18. The non-transitory computer-readable medium of claim 17, wherein the instructions when executed cause the processor to assign priorities to the defect groups based on a count of defects in the defect groups, and perform repeater insertion on the defect groups in order of the assigned priorities.

19. The non-transitory computer-readable medium of claim 17, wherein the instructions when executed cause the processor to assign priorities to the defect groups based on attributes of the defects, and perform repeater insertion on the defect groups in order of the assigned priorities.

20. The non-transitory computer-readable medium of claim 17, wherein the instructions when executed cause the processor to assign priorities to the defect groups based on the associated layout data, netlist data, or both layout data and netlist data, and perform repeater insertion on the defect groups in order of the assigned priorities.

* * * * *